US007706425B2

(12) United States Patent
Takamizawa et al.

(10) Patent No.: US 7,706,425 B2
(45) Date of Patent: Apr. 27, 2010

(54) LITTROW EXTERNAL OSCILLATOR SEMICONDUCTOR LASER OPTICAL AXIS DEVIATION CORRECTION METHOD AND DEVICE

(75) Inventors: Akifumi Takamizawa, Sendai (JP); Keiichi Edamatsu, Natori (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 80 days.

(21) Appl. No.: 11/587,387

(22) PCT Filed: Apr. 22, 2005

(86) PCT No.: PCT/JP2005/007675

§ 371 (c)(1), (2), (4) Date: Jan. 30, 2007

(87) PCT Pub. No.: WO2005/109586

PCT Pub. Date: Nov. 17, 2005

(65) Prior Publication Data

US 2008/0031293 A1 Feb. 7, 2008

(30) Foreign Application Priority Data

May 11, 2004 (JP) ............................ 2004-140503

(51) Int. Cl.
*H01S 3/08* (2006.01)

(52) U.S. Cl. ......................... 372/100; 372/99; 372/102; 359/578; 359/589

(58) Field of Classification Search .................. 372/33, 372/92, 98–102
See application file for complete search history.

(56) References Cited

U.S. PATENT DOCUMENTS

| | | | | |
|---|---|---|---|---|
| 5,594,744 | A | 1/1997 | Lefevre et al. | |
| 5,771,252 | A * | 6/1998 | Lang et al. | 372/20 |
| 5,802,085 | A * | 9/1998 | Lefevre et al. | 372/20 |
| 6,577,665 | B2 | 6/2003 | Vogler et al. | |
| 2003/0112838 | A1* | 6/2003 | Oh et al. | 372/20 |
| 2003/2316941 | | 12/2003 | Marron | |
| 2004/0066829 | A1* | 4/2004 | Tisue | 372/102 |

FOREIGN PATENT DOCUMENTS

| | | |
|---|---|---|
| JP | 5 235453 | 9/1993 |
| JP | 10 107377 | 4/1998 |
| JP | 2001 77453 | 3/2001 |

* cited by examiner

*Primary Examiner*—Minsun Harvey
*Assistant Examiner*—Xnning Niu
(74) *Attorney, Agent, or Firm*—Oblon, Spivak, McClelland, Maier & Neustadt, L.L.P.

(57) ABSTRACT

A Littrow-type external-cavity diode laser optical axis displacement correction method and device to easily, inexpensively, and accurately correct displacement of optical axis in Littrow-type ECDLs is provided. In the Littrow-type ECDL optical axis displacement correction device and method, a means for introducing a laser beam, a jig 36 for integrally fixing a diffraction grating 33 and a prism 35 into which the laser beam is introduced in a predetermined arrangement, and a rotary shaft 34 capable of integrally rotating the diffraction grating 33 and the prism 35 are included. By the rotation of the diffraction grating 33 and the prism 35 around the rotary shaft 34, the wavelength of the incident light can be changed, and the optical axis of the output light 39 is not changed by the change of the wavelength.

4 Claims, 3 Drawing Sheets

LITTROW EXTERNAL OSCILLATOR SEMICONDUCTOR LASER OPTICAL AXIS DEVIATION CORRECTION METHOD AND DEVICE

TECHNICAL FIELD

The present invention relates to a Littrow-type external-cavity diode laser optical axis displacement correction method and device.

BACKGROUND ART

Tunable lasers have been frequently used in the field of atomic spectroscopy, molecular spectroscopy, laser cooling, semiconductor quantum dot spectroscopy, and in the study of quantum information processing.

As such devices, large dye lasers, ti-sapphire lasers and the like have been commercially available by optical component manufacturers. Recently, more inexpensive and compact external cavity diode laser (ECDLs) have come onto the market. In the ECDLs, there are two types; the Littrow-type and the Littman-type.

SUMMARY OF THE INVENTION

Although the above-described Littrow-type ECDLs are convenient and have high performance with respect to output power etc, there is a disadvantage that the optical axis of the output beam shifts depending on changes of wavelengths.

Hereinafter, detailed description will be made with respect to conventional problems.

FIG. 1 is a schematic view illustrating a conventional Littrow-type ECDL, and FIG. 2 is a schematic view illustrating a conventional Littman-type ECDL.

In FIG. 1, reference numeral 1 denotes a laser diode (LD), reference numeral 2 denotes a collimating lens, reference numeral 3 denotes an incident light, reference numeral 4 denotes a diffraction grating, reference numeral 5 denotes a rotary shaft of the diffraction grating 4, reference numeral 6 denotes the first-order diffraction light, reference numeral 7 denotes the zero-order diffraction light (output light), and reference numeral 8 denotes a perpendicular line (dotted line) to the diffraction grating 4.

In FIG. 2, reference numeral 11 denotes a laser diode (LD), reference numeral 12 denotes a collimating lens, reference numeral 13 denotes an incident light, reference numeral 14 denotes a diffraction grating, reference numeral 15 denotes a mirror, reference numeral 16 denotes a rotary shaft of the mirror, reference numeral 17 denotes the first-order diffraction light from the diffraction grating 14, reference numeral 18 denotes a reflected light from the mirror 15, reference numeral 19 denotes the first-order diffraction light from the diffraction grating 14, reference numeral 20 denotes the zero-order diffraction light of the reflected light 18, and reference numeral 21 denotes the zero-order diffraction light (output light).

In the Littrow-type ECDL shown in FIG. 1, light from the laser diode (LD) 1 is collimated by the collimating lens (convex lens) 2 so as to enter the diffraction grating 4, and the zero-order diffraction light 7 and the first-order diffraction light 6 are generated. Then, the first-order diffraction light 6 is fed back to the LD 1, and a cavity is formed between the back-side end face of the LD 1 and diffraction grating 4. By rotating the diffraction grating 4 around the rotary shaft 5, the cavity length and the light wavelength are changed. Since the incident angle of the incident light 3 to the diffraction grating 4 is equal to the output angle of the zero-order diffraction light 7 which is the output light, the direction of the output light 7 changes with the rotation of the diffraction grating 4. That is, the optical axis of the output light 7 shifts depending on the light wavelength.

On the other hand, in the Littman-type ECDL shown in FIG. 2, light from the LD 11 enters the diffraction grating 14 at an incident angle larger than that of the Littrow-type, and the zero-order diffraction light 21 and the first-order diffraction light 17 are generated. Then, since the first-order diffraction light 17 is not fed back to the LD 11, the first-order diffraction light 17 is reflected straight by using the mirror 15. The reflected light 18 enters the diffraction grating 14 again, and the zero-order diffraction light 20 and the first-order diffraction light 19 are generated again. The first-order diffraction light 19 of the reflected light 18 is fed back to the LD 11, and a cavity is formed between the back-side end face of the LD 11 and the mirror 15. In this method, by rotating the mirror 15 while the diffraction grating 14 is fixed, the wavelength is changed. Accordingly, the optical axis of the output light (the zero-order diffraction light of the incident light 13 from the LD 11) 21 does not depend on the wavelength and is constant.

However, the Littman-type ECDLs are more complex in the configuration than the Littrow-type ECDLs. Further, the zero-order diffraction light 20 which is the reflected light from the mirror 15 becomes a loss and the output power is decreased. Moreover, the feedback efficiency is decreased since the light returns to the LD 11 after two times of diffractions. As a result, the variable range of wavelength is narrowed.

Accordingly, in the Littrow-type ECDLs, if the change of the optical axis of the output light 7 due to the rotation of the diffraction grating 4 is dissolved, the Littrow-type ECDLs have higher performance than the Littman-type ECDLs.

As an optical axis displacement correction method in the Littrow-type ECDLs, there is a method using a mirror.

FIG. 3 is a schematic view of a Littrow-type ECDL optical axis displacement correction device which uses a mirror.

In this drawing, reference numeral 21 denotes a laser diode (LD), reference numeral 22 denotes a collimating lens, reference numeral 23 denotes an incident light, reference numeral 24 denotes a diffraction grating, reference numeral 25 denotes a rotary shaft of the diffraction grating 24, reference numeral 26 denotes a mirror, reference numeral 27 denotes a jig for fixing the diffraction grating 24 and the mirror 26 in a predetermined arrangement (arranged so that the diffraction grating 24 and the mirror 26 are parallel and face each other), and reference numeral 28 denotes the zero-order diffraction light (output light).

In this correction device, as shown in FIG. 3, the diffraction grating 24 and the mirror 26 are arranged on the same jig 27 so as to be parallel and face each other, and are rotated. Thus, it is always possible to make the direction of the output light 28 from the ECDL system be parallel with the incident light 23 which comes from the LD 21 to the diffraction grating 24. However, it is incomplete because if the wavelength is changed by rotating the jig 27 around the rotary shaft 25, the optical axis of the output light 28 moves in parallel.

In the study of the quantum information processing, because it is necessary to select an optimum wavelength after light from a tunable laser is coupled with a fine waveguide of a size less or equal to 10 μm, displacement of the optical axis due to wavelength change is a serious problem. Especially, in a case of blue light, because the diffraction efficiency is low, the advantage with respect to the feedback efficiency of light in the Littrow-type ECDLs capable of configuring an external cavity at one diffraction becomes more significant. From the above reasons, an effective method to solve the problem in relation to the correction of optical axis displacement in Littrow-type ECDLs has been researched.

In consideration of the above problems, the present invention provides a Littrow-type ECDL optical axis displacement correction method and device to easily, inexpensively, and accurately correct displacement of optical axis in Littrow-type ECDLs.

[1] A Littrow-type external-cavity diode laser optical axis displacement correction method, in which a diffraction grating and a prism are integrally fixed by a jig in a predetermined arrangement, while a wavelength of incident light is changed by rotation of a rotary shaft of the diffraction grating and the prism, an optical axis of the output light is not changed by the change of the wavelength.

[2] A Littrow-type external-cavity diode laser optical axis displacement correction device, the device includes a means for introducing a laser beam, a jig for integrally fixing a diffraction grating and a prism in a predetermined arrangement, the diffraction grating and the prism to which the laser beam is introduced, and a rotary shaft capable of integrally rotating the diffraction grating and the prism.

[3] The Littrow-type external-cavity diode laser optical axis displacement correction device according to the [2], the prism is a column-shaped prism having a bottom surface of a right-angled isosceles triangle.

[4] The Littrow-type external-cavity diode laser optical axis displacement correction device according to the [3], a grating surface of the diffraction grating and a surface which is a hypotenuse of the right-angled isosceles triangle of the column-shaped prism are arranged in parallel.

BEST MODE FOR CARRYING OUT THE INVENTION

In spite of a change in wavelength, it is possible to maintain the axis of the output light unchanged by having a means for introducing a laser beam, a jig for integrally fixing a diffraction grating and a prism into which the laser beam is introduced so as to be a predetermined arrangement, and a rotary shaft capable of integrally rotating the diffraction grating and the prism.

Embodiment

An embodiment of the present invention is described in detail with reference to the drawings.

Figure 1:
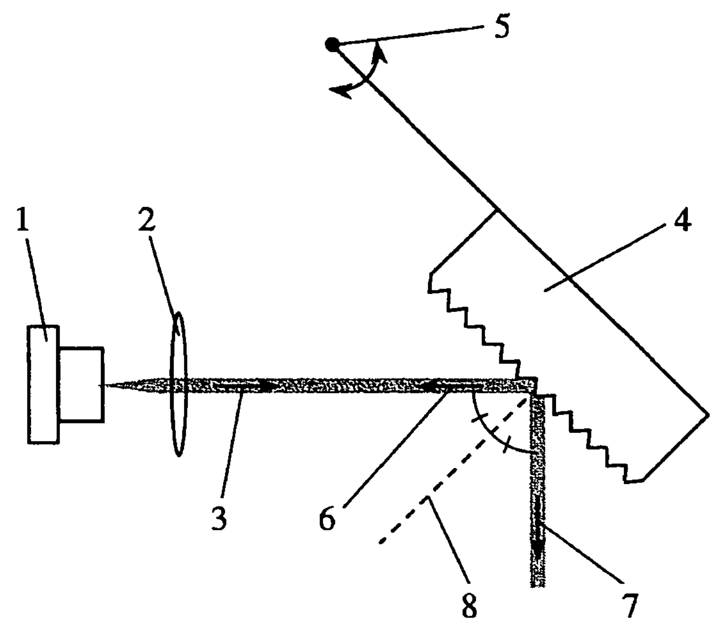
FIG. 1 is a schematic view illustrating a conventional Littrow-type ECDL.
Figure 2:
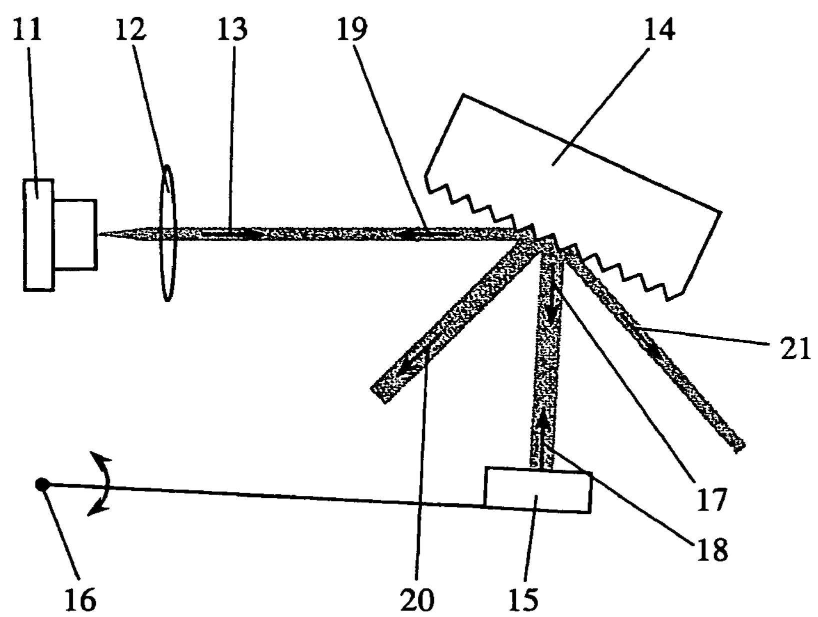
FIG. 2 is a schematic view illustrating a conventional Littman-type ECDL.
Figure 3:
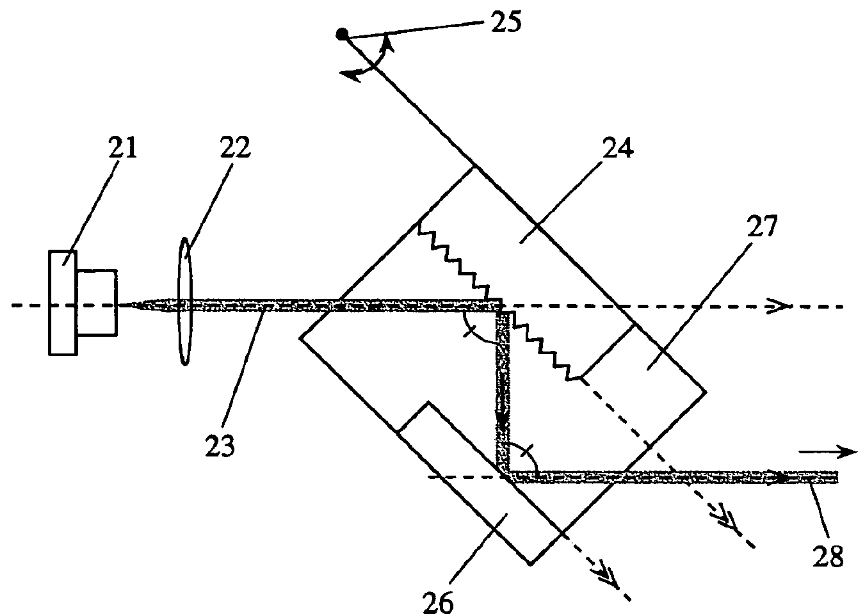
FIG. 3 is a schematic view illustrating a device for correcting displacement of optical axis in a Littrow-type ECDL which uses a mirror.
Figure 4:
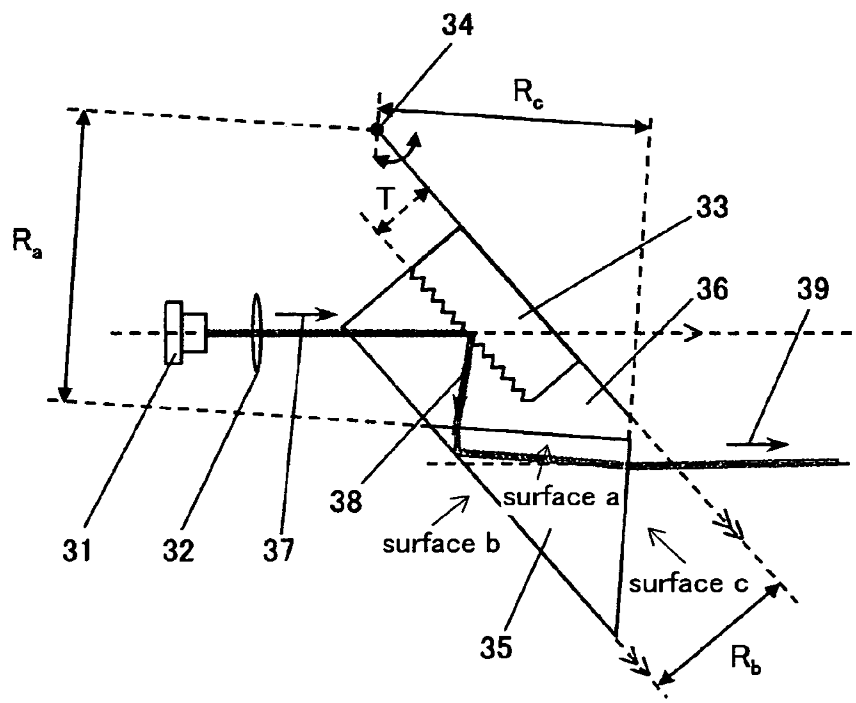
FIG. 4 is a schematic view illustrating a Littrow-type ECDL which uses a prism according to an embodiment of the present invention.

FIG. 4 is a Littrow-type ECDL which uses a prism according to an embodiment of the present invention.

In this drawing, reference numeral 31 denotes a laser diode (LD), reference numeral 32 denotes a collimating lens, reference numeral 33 denotes a diffraction grating, reference numeral 34 denotes a rotary shaft of the diffraction grating 33, reference numeral 35 denotes a column-shaped prism having a bottom surface of a right-angled isosceles triangle, reference numeral 36 denotes a jig for fixing the diffraction grating 33 and the prism 35 in a predetermined arrangement (arrangement so that the grating surface of the diffraction grating 33 and surface b which is a hypotenuse of the right-angled isosceles triangle, are parallel to each other), reference numeral 37 denotes an incident light, reference numeral 38 denotes the zero-order diffraction light, and reference numeral 39 denotes an output light. As the jig 36, for example, a plate-like material for fixing the surface of the diffraction grating 33 and at least one side surface of the prism 35 can be used.

Hereinafter, the principle of the present invention in a case in which the column-shaped prism 35 having the bottom surface of a right-angled isosceles triangle shape is used will be described. For the sake of simplicity, as shown in FIG. 4, each of the three side surfaces of the prism 35 is referred to as surface a, surface b, and surface c, respectively. The prism 35 and the diffraction grating 33 are arranged on the same jig 36 so that the surface b of the prism and the grating surface are parallel each other.

Figure 5:
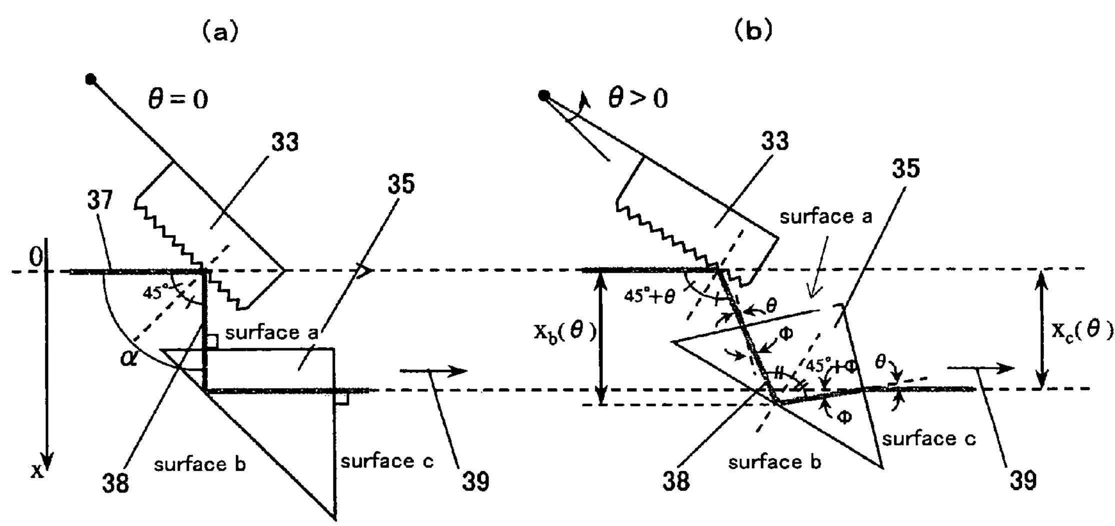
FIG. 5 is a view for explaining operation of the Littrow-type ECDL which uses a prism according to an embodiment of the present invention.

In FIG. 5, two cases of the optical axis are described in which while the incident light 37 from the LD 31 enters into the diffraction grating 33, obtains the zero-order diffraction light 38, transmits through the prism 35 to be the output light 39, the incident angle to the diffraction grating 33 is 45° (FIG. 5(*a*)), or greater than 45° (FIG. 5(*b*)). In the description below, the case in which the incident angle to the diffraction grating 33 is 45° is considered as a reference and a counter-clockwise rotation angle of the diffraction grating 33 is described as $\theta$. For the sake of simplicity, the direction of the optical axis of the zero-order diffraction light 38 from the diffraction grating 33 is described as an angle $\alpha$ which is formed by the incident light 37 from the LD 31 to diffraction grating 33 and the zero-order diffraction light 38 (when light proceeds in the lower direction in FIG. 5 is to be positive).

First, as shown in FIG. 5(*a*), a case in which the rotation angle $\theta=0$ is described. The zero-order diffraction light 38 proceeds in the direction of $\alpha=90°$, enters the prism surface a at the angle of 0°, transmits without refraction. Then, the light is totally reflected at the prism surface b, proceeds in the direction of $\alpha=180°$, transmits through the prism surface c without refraction, and is output as the output light 39.

Next, as shown in FIG. 5(*b*), a case in which the rotation angle $\theta$ is not 0° is described. In this case, it should be taken in account that not only the diffraction grating 33 but also the prism 35 rotates by the angle of $\theta$. After the incident light 37 from the LD 31 has entered the diffraction grating 33 at the angle $45°+\theta$, the zero-order diffraction light 38 is generated in the direction of $\alpha=90°+2\theta$, enters the prism surface a at the angle of $\theta$, and is refracted. If a refraction index of the prism 35 is descried as n, a refraction angle $\Phi$ is given as $$\sin \Phi=\sin \theta/n \quad (1)$$

The light after being refracted on the prism surface a proceeds in the direction of $\alpha=90°+\theta+\phi$, enters the prism surface b at the angle $45°+\phi$ and totally reflected, and proceeds in the direction of $\alpha=180°+\theta-\phi$. The light enters the prism surface c at the angle of $\phi$ and is refracted. Then, the refracting angle $\chi$ is given as $$\sin \lambda=n \sin \phi \quad (2)$$

By comparison between the above formula (1) and formula (2), $\chi=0$. Accordingly, the light after refracted at the prism surface c, that is, the output light of the ECDL system shown in FIG. 4, is always output in the direction of $\alpha=180°$ irrespective of the rotation angle $\theta$.

If the refraction index n of the prism 35 is n>1, since $|\phi|<|\theta|$ and $\phi$ and $\theta$ become the same sign according to the above formula (1), the direction of the light totally reflected by the prism surface b $\alpha=180°+\theta-\phi$ becomes $\alpha<180°$ when $\theta<0$, and $\alpha>180°$ when $\theta>0$. Therefore, as shown in FIG. 5, if an x axis is taken in the direction perpendicular to the optical axis of the incident light 37 which proceeds toward the diffraction grating 33 from the LD 31, and x coordinates of incident positions of the light to the prism surface b and the prism surface c are described as $x_b(\theta)$ and $x_c(\theta)$ respectively, and if positions of the prism surface a and the prism surface b are determined so as to satisfy $x_b(\theta)<x_c(\theta)$ when $\theta<0$, and $x_b(\theta)>x_c(\theta)$ when $\theta>0$, proceeds in a direction approaching $x_c(\theta)$ independently on $\theta$. If a position of the prism surface c is determined, it is possible to obtain $x_c(\theta)=x_c(\theta)$.

When a grid interval d of the diffraction grating 33 is determined in relation to light wavelength, it is possible to make $|\theta|$ smaller enough than 1 rad (:=57.3°), thus it is possible to approximate $x_c(\theta)$ to a term of the first order in power series expansion to $\theta$. That is, by using coefficients $a_0$ and $a_1$, $x_c(\theta)$ can be given as $$x_c(\theta)\cong a_0+a_1\theta$$

Then, in order to satisfy a condition $x'_c(\theta)=0$ which is a condition that $x_c(\theta)$ does not depends on $\theta$, it is required to be $a_1=0$. As shown in FIG. 4, distances from the rotary shaft 34 to the prism surface a, surface b, surface c, and the diffraction grating surface are indicated as $R_a$, $R_b$, $R_c$, and T, respectively. By following the positions and directions of the optical axis by repeating the simple calculations, $a_1$ can be obtained as a function of $R_a$, $R_b$, $R_c$, T, and n. As a result, the following formula can be obtained as a condition to satisfy $a_1=0$ $$\frac{1}{\sqrt{2}}(n-1)(R_c-R_a)+nT-R_b=0 \tag{4}$$

As an example, light from a LD having central wavelength of 785 nm which have been manufactured in large quantities is, by using an external cavity which is formed by a diffraction grating of grating frequency of 1/d=1800 lines/mm, swept over a wide range of ±15 nm, and an optical axis correction is performed by using a prism made of BK7 glass which is widely used. In this case, the rotation angle $\theta$ to a wavelength $\lambda$ is given as $$\theta=[\sin^{-1}(\lambda/2d)]-45° \tag{5}$$

When the wavelength is 780±15 nm, it becomes $-1.13°<\theta<+1.05°$, and satisfies the condition of $\theta\ll 1$rad. Although the refraction index n depends on light wavelength, if the prism made of BK7 glass is used, and the light wavelength is within the range of about ±15 nm in visible and infrared regions, the refraction index n can be considered constant. Actually, within the wavelength of 780±15 nm, values by two places of decimals do not change, and n=1.51. Then, if T=6.7 mm, $R_b$=10 mm, $R_c-R_a$=−0.33 mm, the formula (4) is satisfied. In order to satisfy these conditions, for example, a triangular pole-like prism which has a bottom surface of right-angled isosceles triangle in which two sides have the same length of 13.8 mm can be arranged adjacent to the diffraction grating. In such a configuration, the overall optical system can be accommodated on a substrate of about 5 cm×5 cm, and it is very compact as a laser light source for tunable lasers. In this example, the triangular prism being sold as standard goods by optical component manufacturers is used. However, any shape can be allowed if positions of three surfaces of a prism through which light transmits satisfies the formula (4). Accordingly, by cutting off the part where light does not transmit, it is possible to further reduce the size.

In the conventional devices which use a mirror, if the position and angle of the mirror to the rotation angle $\theta$ is controlled by a computer, it may be possible to control the parallel movement of the optical axis of the output light. However, the computer control is costly, the system becomes complex, and a space is necessary to externally place the computer. Further, since a micromotion system such as a motor is necessary to move the position of the mirror, the cost further increases and the size of the system of the ECDL increases. The present invention which does not rely on the computer control is very effective in that the optical axis of the Littrow-type ECDL having high performance can be easily, inexpensively, and accurately corrected and the whole size can be reduced.

It is to be understood that the invention is not limited to the above embodiments, various modifications can be made, and these are therefore considered to be within the scope of the invention.

The present invention relates to the Littrow-type external-cavity diode laser optical axis displacement correction method and device which uses the prism, the diffraction grating and the prism are integrally fixed in a predetermined arrangement, by rotation of the rotary shaft of the integrally fixed diffraction grating and the prism, the wavelength of the incident light can be tuned, and the optical axis of the output light is not changed by the change of the wavelength of the light.

Accordingly, it is expected that all technological fields which use the ECDLs are to be effected. Especially, a big demand can be expected in experiments such as semiconductor quantum dot spectroscopy in which a wavelength is greatly swept or experiments in the study of the quantum information processing in which light has to be coupled with optimizing the wavelength into a narrow wavelength of the size of less or equal to 10 μm.

INDUSTRIAL APPLICABILITY

The Littrow-type external-cavity diode laser optical axis displacement correction method and device which uses the prism according to the present invention can be used in the field of atomic spectroscopy, molecular spectroscopy, laser cooling, semiconductor quantum dot spectroscopy, and quantum information processing.

The invention claimed is:

1. A Littrow-type external-cavity diode laser optical axis displacement correction method, comprising:

inputting laser light from a laser source into a diffraction grating and a prism integrally fixed by a jig such that the laser light is reflected by the diffraction grating and zero-order diffraction light enters the prism through a first surface (a) of the prism, the zero-order diffraction light then being reflected within the prism off a second surface (b) of the prism so that the zero-order diffraction light exits the prism as output light through a third surface (c) of the prism in the opposite direction of the laser source; and while the wavelength of the output light is changed by rotating the diffraction grating and the prism around a rotary shaft, the zero-order diffraction light is reflected and refracted within the prism so that the optical axis of the output light is not changed by the change in the wavelength of the output light.

2. A Littrow-type external-cavity diode laser optical axis displacement correction device comprising:

a laser source configured to introduce a laser beam;

a jig in which a diffraction grating and a prism are integrally fixed; and a rotary shaft configured to integrally rotate the diffraction grating and the prism, wherein the diffraction grating and the prism are fixed so that the laser beam is reflected off the diffraction grating and zero-order diffraction light enters the prism through a first surface (a) of the prism, and so that the zero-order diffraction light is reflected within the prism off a second surface (b) of the prism so that the zero-order diffraction light exits the prism as output light through a third surface (c) of the prism in the opposite direction of the laser source, so that the optical axis of the output light is not changed by a change in the wavelength of the output light.

3. The Littrow-type external-cavity diode laser optical axis displacement correction device according to claim 2, wherein the prism is a column-shaped prism including a bottom surface of a right-angled isosceles triangle.

4. The Littrow-type external-cavity diode laser optical axis displacement correction device according to claim 3, wherein a grating surface of the diffraction grating and a surface that is a hypotenuse of the right-angled isosceles triangle of the column-shaped prism are arranged in parallel.

* * * * *